(12) United States Patent
Song

(10) Patent No.: US 8,005,176 B2
(45) Date of Patent: Aug. 23, 2011

(54) ARCHITECTURE FOR SYSTOLIC NONLINEAR FILTER PROCESSORS

(75) Inventor: William S. Song, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 705 days.

(21) Appl. No.: 12/030,913

(22) Filed: Feb. 14, 2008

(65) Prior Publication Data

US 2008/0198914 A1    Aug. 21, 2008

Related U.S. Application Data

(60) Provisional application No. 60/890,173, filed on Feb. 15, 2007.

(51) Int. Cl.
*H04B 1/10*    (2006.01)
(52) U.S. Cl. ......................................................... 375/350
(58) Field of Classification Search .................. 375/316, 375/346, 350, 232, 143, 152, 343; 379/390.02; 370/290, 291; 455/213, 339; 708/314
See application file for complete search history.

(56) References Cited

U.S. PATENT DOCUMENTS

| | | | |
|---|---|---|---|
| 4,725,972 A | 2/1988 | Gockler | |
| 4,758,999 A | 7/1988 | Marwood et al. | |
| 5,450,339 A | 9/1995 | Chester et al. | |
| 5,917,735 A | 6/1999 | Ko | |
| 6,014,682 A | 1/2000 | Stephen et al. | |
| 6,023,718 A | 2/2000 | Dischert et al. | |
| 6,032,171 A | 2/2000 | Kiriaki et al. | |
| 6,141,378 A | 10/2000 | d'Oreye de Lantremange | |
| 6,192,386 B1 | 2/2001 | Shinde | |
| 6,324,559 B1 | 11/2001 | Hellberg | |
| 6,362,701 B1 | 3/2002 | Brombaugh et al. | |
| 6,639,537 B1 | 10/2003 | Raz | |
| 6,650,688 B1 | 11/2003 | Acharya et al. | |
| 6,653,959 B1 | 11/2003 | Song | |
| 6,731,706 B1 | 5/2004 | Acharya et al. | |
| 6,820,103 B2 | 11/2004 | Butler et al. | |
| 6,965,640 B2 * | 11/2005 | Awad et al. ................... 375/232 |
| 6,970,895 B2 | 11/2005 | Vaidyanathan et al. | |
| 7,173,555 B2 | 2/2007 | Raz | |
| 7,188,135 B2 | 3/2007 | Takatori et al. | |

(Continued)

OTHER PUBLICATIONS

Wang, D. et al.; High Technology Letters; "A Low Power/Area Digital FIR Filter Design Based on PRF Framework"; vol. 8, No. 3, pp. 57-61; Sep. 2002.

Wang, C. et al.; IEEE; "A Digital-Serial VLSI Architecture for Delayed LMS Adaptive FIR Filtering", pp. 545-548; Feb. 1995.

(Continued)

*Primary Examiner* — Sam K Ahn
(74) *Attorney, Agent, or Firm* — Guerin & Rodriguez, LLP; Michael A. Rodriguez

(57) ABSTRACT

Described are nonlinear filter processors having an array of polynomial nonlinear filters including a first polynomial nonlinear filter and a last polynomial nonlinear filter. The first polynomial nonlinear filter has an input terminal for receiving an input data sample. The polynomial nonlinear filters systolically pass the input data sample from the first polynomial nonlinear filter to the last polynomial nonlinear filter. Each polynomial nonlinear filter produces an output data sample based on the input data sample. In addition, each polynomial nonlinear filter other than the last polynomial nonlinear filter systolically passes the output data sample generated by that polynomial nonlinear filter to a neighboring polynomial nonlinear filter. Each polynomial nonlinear filter other than the first polynomial nonlinear filter sums a nonlinearly filtered input data sample produced by that polynomial nonlinear filter with the output data sample received from a neighboring polynomial nonlinear filter.

28 Claims, 13 Drawing Sheets

U.S. PATENT DOCUMENTS

| | | | | |
|---|---|---|---|---|
| 7,245,651 | B1* | 7/2007 | Miao et al. | 375/147 |
| 7,480,689 | B2 | 1/2009 | Song | |
| 7,796,068 | B2 | 9/2010 | Raz et al. | |
| 2003/0072362 | A1* | 4/2003 | Awad et al. | 375/232 |
| 2003/0200243 | A1 | 10/2003 | Yomo et al. | |
| 2004/0143615 | A1 | 7/2004 | Yomo et al. | |
| 2006/0112157 | A1* | 5/2006 | Song | 708/300 |
| 2006/0133470 | A1* | 6/2006 | Raz et al. | 375/232 |

OTHER PUBLICATIONS

Abdel-Raheem, E. et al.; IEEE; "Systolic Implementation of Polyphase Decimators and Interpolators"; pp. 749-752; May 1995.

Lee, H. et al.; National Chiao Tung University; "The Design of Two-Dimensional FIR and IIR Filter Architectures for HDTV Signal Processing"; VLSITSA 1991; pp. 307-311.

Song, W. et al.; IEEE; MIT Lincoln Laboratory; "High-Performance Low-Power Bit-Level Systolic Array Signal Processor with Low-Threshold Dynamic Logic Circuits"; 2001; pp. 144-147.

International Search Report for international Application No. PCT/US2008/53906 dated Jun. 5, 2008; 2 pages.

Kam et al., Nonlinear Equalization of {RF} Receivers, Proc. HPCMP Users Group Conf., 2006, pp. 303-307, IEEE Computer Society, Denver CO.

Kam et al., Nonlinear Equalization of {RF} Receivers, Proc. Tenth Annual HPEC Workshop, Sep. 19, 2006, Lexington MA.

Non-final Office Action dated Mar. 18, 2008 for related copending U.S. Appl. No. 10/993,076.

Notice of Allowance dated Oct. 2, 2008 for related U.S. Appl. No. 10/993,076.

* cited by examiner

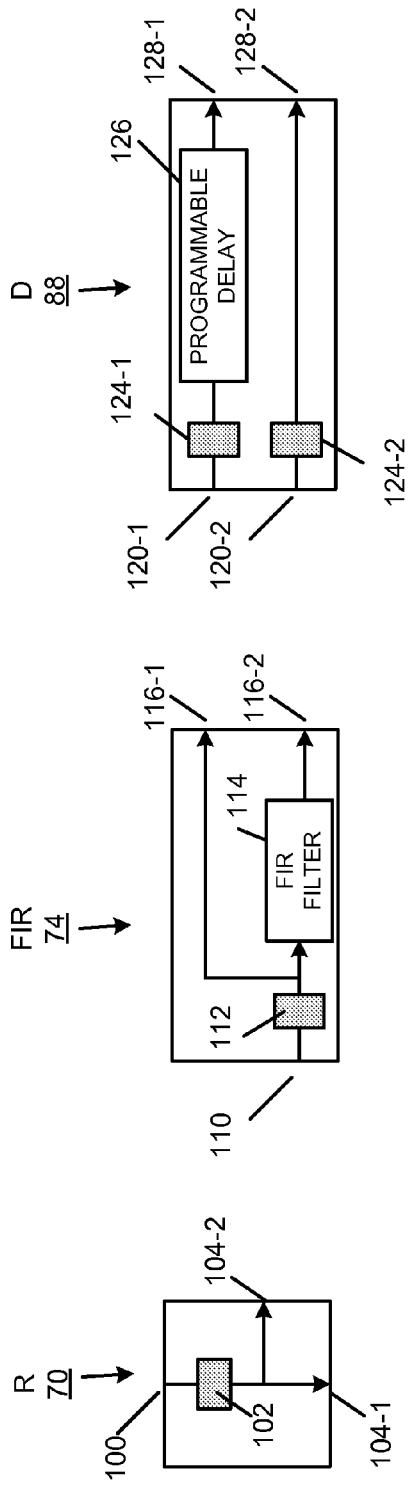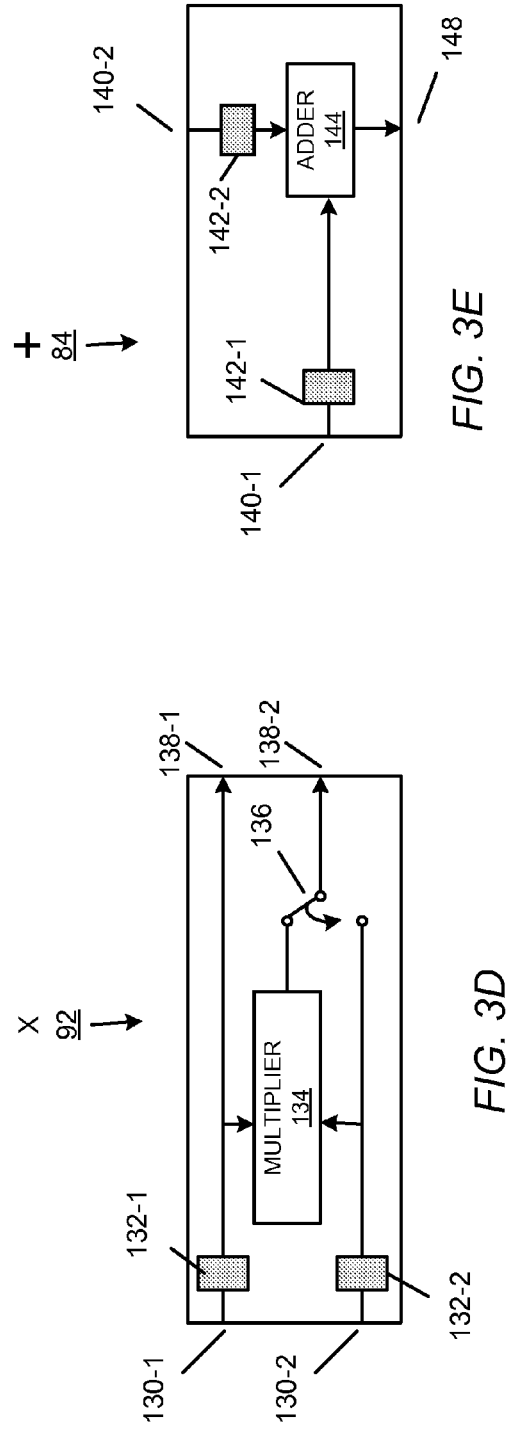

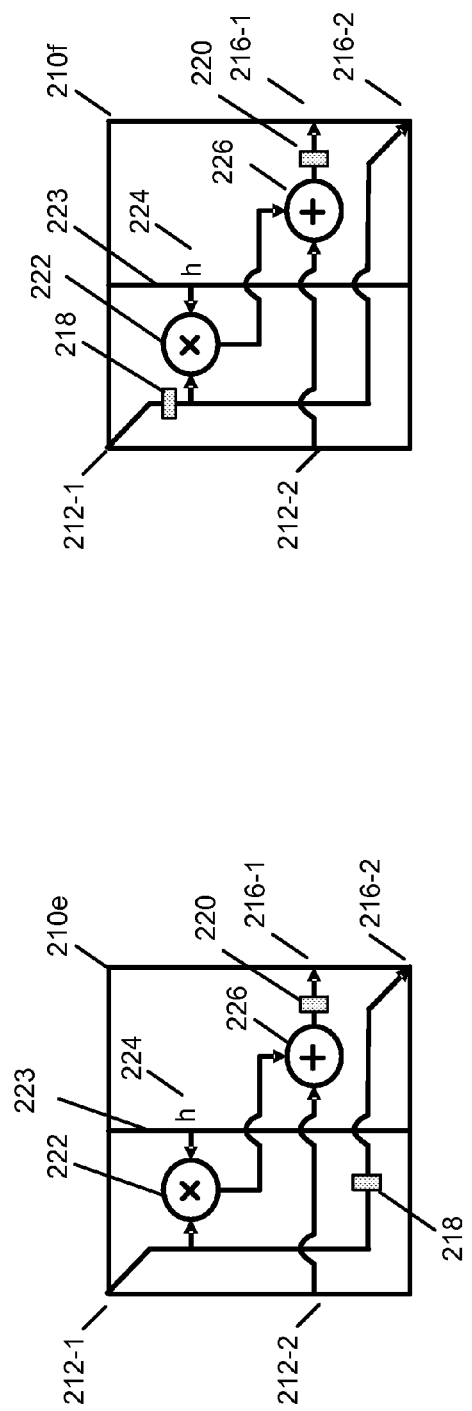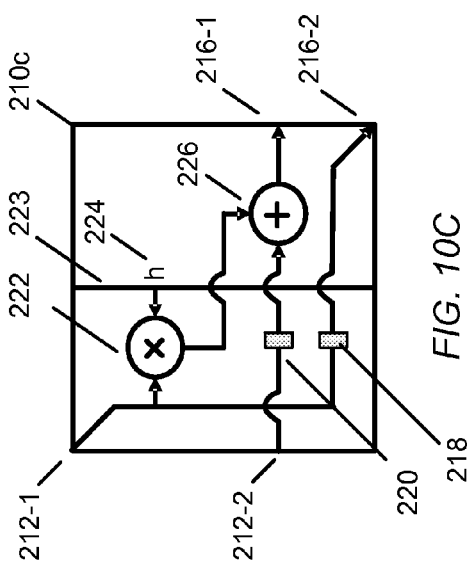
FIG. 10A
FIG. 10B
FIG. 10C

ARCHITECTURE FOR SYSTOLIC NONLINEAR FILTER PROCESSORS

RELATED APPLICATION

This utility application claims the benefit of U.S. Provisional Patent Application No. 60/890,173, filed on Feb. 15, 2007, the entirety of which provisional application is incorporated by reference herein.

GOVERNMENT RIGHTS IN THE INVENTION

This invention was made with government support under grant number FA8721-05-C-0002 awarded by the Air Force. The government has certain rights in this invention.

FIELD OF THE INVENTION

The invention relates generally to signal processing. More specifically, the invention relates to nonlinear filter processors for use in various signal-processing applications.

BACKGROUND

High-speed signal-processing applications can use nonlinear filter processors to linearize analog-to-digital converters, RF (radio frequency) amplifiers, IF (intermediate frequency) amplifiers, mixers, transmit amplifiers, and entire receivers. Examples of signal-processing applications include, but are not limited to, communications, video, radar, electronic warfare, and signal intelligence. High linearity is critical to many such receiver and sensor applications, particularly for receiver systems that frequency-channelize an input signal into multiple sub-bands. The frequency-channelization process can enhance the in-band signal-to-noise ratio (SNR) by removing out-of-band noise. The higher SNR, though, then requires spurs and intermods of the sensor to be even lower in order to prevent interfering with signal detection.

Linearity is also important for receiver systems that combine signals from multiple antennas. The beam-forming process with multiple antennas can enhance SNR because the signals add coherently and noises add incoherently. Therefore, high linearity is often desirable for multiple antenna receiver systems.

The use of polynomial nonlinear filters can enhance linearity by mathematically subtracting out nonlinearities generated by the sensors. For high data rate applications, application-specific processors are often used to implement nonlinear filters because of the high computational throughput requirement. Application-specific processors are able to provide higher computational throughput and greater power efficiency than programmable processors.

Technology for implementing application-specific processors includes FPGA (Field Programmable Gate Array), standard cell, and full custom integrated circuits (ICs). In the design of such chips, important criteria include minimizing die area, maximizing clock speed, maximizing computational throughput, and minimizing power consumption. Therefore, there is a need for a nonlinear equalization processor architecture well suited for highly optimized IC level implementations that satisfy these design criteria.

SUMMARY

In one aspect, the invention features a systolic polynomial nonlinear filter comprising a clocked register for receiving an input data sample and a finite impulse response (FIR) module receiving the input data sample from the clocked register. The FIR module has a FIR filter for producing a FIR-filtered data sample from the input data sample. A pipeline of clocked delay-multiplication modules includes a first delay-multiplication module in communication with the FIR module to receive the input data sample and the FIR-filtered data sample.

The first delay-multiplication module has a delay module in communication with a multiplication module. The delay module has a first input terminal for receiving the input data sample from the FIR module, a second input terminal for receiving the FIR-filtered data sample from the FIR module, and a programmable delay circuit for delaying the input data sample. The multiplication module has a first input terminal for receiving the delayed input data sample from the delay module, a second input terminal for receiving the FIR-filtered data sample from the delay module, and a multiplier for multiplying the delayed input data sample with the FIR-filtered data sample.

In another aspect, the invention features a nonlinear filter processor comprising an array of polynomial nonlinear filters including a first polynomial nonlinear filter and a last polynomial nonlinear filter. The first polynomial nonlinear filter has an input terminal for receiving an input data sample. The polynomial nonlinear filters systolically pass the input data sample from the first polynomial nonlinear filter to the last polynomial nonlinear filter. Each polynomial nonlinear filter produces an output data sample based on the input data sample.

Each polynomial nonlinear filter other than the last polynomial nonlinear filter systolically passes the output data sample generated by that polynomial nonlinear filter to a neighboring polynomial nonlinear filter. Each polynomial nonlinear filter other than the first polynomial nonlinear filter sums a nonlinearly filtered input data sample produced by that polynomial nonlinear filter with the output data sample received from the neighboring polynomial nonlinear filter.

In still another aspect, the invention features a stacked filter, comprising an array of finite impulse response (FIR) filters including a first FIR filter and a second FIR filter. Each FIR filter has a plurality of taps including a first tap, a last tap, and zero or more intermediate taps arranged in a pipeline. Each tap other than the last tap in the pipeline of the first FIR filter is in communication with one of the taps in the second FIR filter. Each tap of the first FIR filter concurrently receives an input data sample during a first clock cycle and each tap other than the last tap in the pipeline of the first FIR filter systolically passes the input data sample to one of the taps of the second FIR filter during a second clock cycle.

In still yet another aspect, the invention features a method for filtering an input data sample. The method comprises arranging a plurality of polynomial nonlinear filters in a pipelined array having a first polynomial nonlinear filter, a last polynomial nonlinear filter, and zero or more intermediate polynomial nonlinear filters. The input data sample is systolically distributed to each polynomial nonlinear filter in the pipelined array. Each polynomial nonlinear filter produces a nonlinearly filtered data sample based on the input data sample and an output data sample based on that nonlinearly filtered data sample. Each polynomial nonlinear filter other than the last polynomial nonlinear filter in the pipelined array passes the output data sample produced by that polynomial nonlinear filter to a neighboring polynomial nonlinear filter. Each polynomial nonlinear filter other than the first polynomial nonlinear filter sum the nonlinearly filtered data sample produced by that polynomial nonlinear filter with the output data sample received from a neighboring polynomial nonlinear filter, thereby generating the output data sample produced by that polynomial nonlinear filter.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 3A, FIG. 3B, FIG. 3C, FIG. 3D, and FIG. 3E are functional block diagrams of embodiments of various modules used in the implementation of the polynomial nonlinear filters of FIG. 2.

FIG. 10A, FIG. 10B, and FIG. 10C are different embodiments of computational units that may be used in the implementation of the systolic polyphase FIR filter of FIG. 9.

DETAILED DESCRIPTION

Processors implementing the present invention employ a high-performance systolic nonlinear filter processor architecture that can be used to linearize many analog, RF, and mixed signal circuitry. The architecture is particularly suited for high performance integrated circuit implementations. The systolic architecture consists of regular arrays of relatively simple replicated computation or processing modules with neighbor communications paths. The architecture facilitates increased data rate along with reduced design effort, integrated circuit die size, and power consumption. The architecture scales to support extremely high data rate applications.

Figure 1:
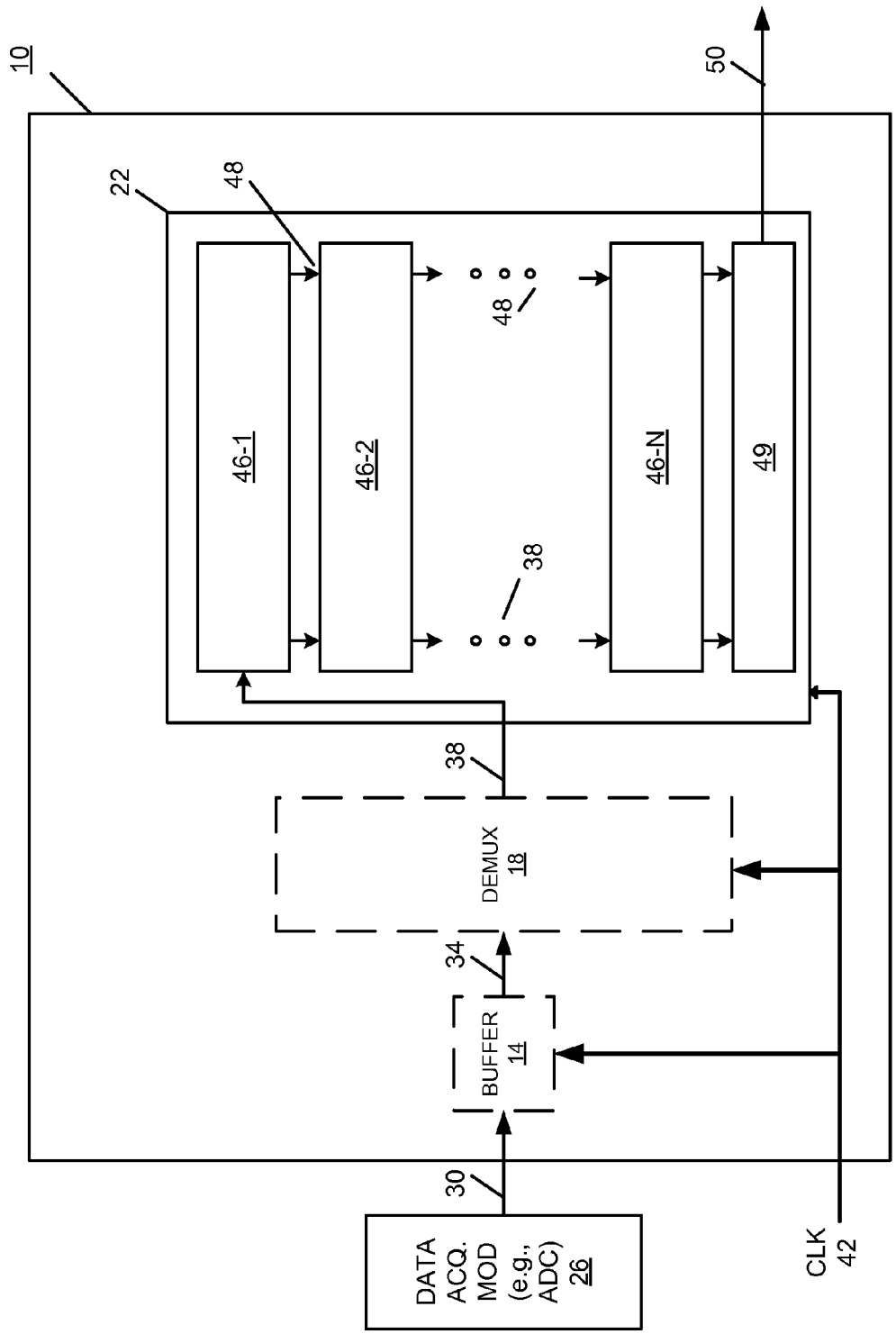
FIG. 1 is a functional block diagram of an embodiment of a nonlinear filter processor including a systolic nonlinear filter.

FIG. 1 is a functional block diagram of an embodiment of an application-specific nonlinear filter processor 10 for use in filtering input data samples acquired by a signal-processing application. For ASIC implementations, hardware (also called circuitry or logic) such as multipliers, adders, and registers, implement the filtering functionality of the processor 10. In other embodiments, the processor 10 may be programmable, have its own native instruction code and local registers, and be designed to execute arithmetic operations more rapidly and efficiently than standard microprocessors. The nonlinear filter processor 10 may also implement instruction-level parallelism and operate in an architecture that supports multiple operations in a single clock cycle. Examples of such implementations of a nonlinear filter processor are finite state machines and digital signal processors (DSPs).

In one embodiment, the nonlinear filter processor 10 includes a buffer module 14, a demultiplexor 18, and a digital nonlinear filter 22 for providing polynomial nonlinear equalization filtering. The buffer module 14 and demultiplexor 18 can be implemented externally to the nonlinear filter processor 10 without departing from the principles of the invention.

The buffer module 14 is in communication with a data acquisition module 26 by way of a signal bus 30. In general, the data acquisition module 26 includes logic or circuitry for receiving input signals and producing digital input data therefrom. Here, an analog-to-digital (A/D) converter illustrates an example of the data acquisition module 26. As another example, described in more detail below, the data acquisition module 26 includes a plurality of time-interlaced A/D converters. Although shown external to the nonlinear filter processor 10, this data acquisition module 26 can be part of the nonlinear filter processor 10 without departing from the principles of the invention.

Digital input data arrive at the buffer module 14 from the data acquisition module 26 over the signal bus 30. These digital input data correspond to data samples acquired by the signal-processing application at discrete moments in time. Typically, data samples of high-speed applications can have 8 to 16 bits of data, and those of high-precision applications, as many as 32 bits. Other data sample sizes can be used without departing from the principles of the invention. Hereafter, the digital input data are also referred to as input data samples.

The buffer module 14 forwards the input data samples to the demultiplexor 18 over signal lines 34, and the demultiplexor 18 forwards the input data samples over signal lines 38 to the appropriate input terminals of the nonlinear filter 22. The buffer module 14 can hold a number of the incoming data samples so that a plurality of such data samples can be sent concurrently to the nonlinear filter 22.

In some embodiments, the input data samples pass directly from the data acquisition module 26 to the nonlinear filter 22 or directly from the buffer module 14 to the nonlinear filter 22 (i.e., the demultiplexor 18, the buffer module 14, or both are optional—hence, they are shown in dashed lines). Arrival of the input data samples at the nonlinear filter 22 occurs at a given rate, hereafter referred to as the input data rate, in accordance with an input clock 42.

The nonlinear filter 22 includes an array of polynomial nonlinear filters 46-1, 46-2, 46-$n$ (generally, 46) connected in pipeline fashion. Clock signals from the input clock (CLK) 42 pass to the nonlinear filter processor 10 and synchronize the operations of the buffer module 14, demultiplexor 18, and array of polynomial nonlinear filters 46. During operation, input data samples and computed results move systolically down and across the array polynomial nonlinear filters 46 in synchronism with each clock signal.

In brief overview, during each array clock cycle, one or more input data samples 38 arrive from the demultiplexor 18 at the first polynomial nonlinear filter 46-1. During subsequent clock cycles, the input data samples 38 propagate systolically down through the array of polynomial nonlinear filters 46. The input data samples 38—and filtered results computed therefrom—also propagate systolically across each polynomial nonlinear filter 46. Each polynomial nonlinear filter 46 produces an output data signal (or output data) 48 based on the input data samples 38. All but the last polynomial nonlinear filter 46 in the pipeline passes its generated output data signal 48 to the next polynomial nonlinear filter 46 in the pipeline. All but the first polynomial nonlinear filter 46 in the pipeline combines the output data signal 48 received from the previous polynomial nonlinear filter 46 in the pipeline with its own filtered data signal. The output data signal generated by the last polynomial nonlinear filter 46 and the input data sample pass to an equalization module 49, which produces the output 50 of the nonlinear filter 22. It is to be understood that the terms first, last, left, right, top, bottom, vertical, horizontal, leftmost, rightmost, topmost and bottommost, as used herein, are relative terms used to simplify the description of the invention and are not intended to limit the principles of the invention to a particular direction in which input data samples and computed results flow through the systolic array of polynomial nonlinear filters 46.

Figure 2:
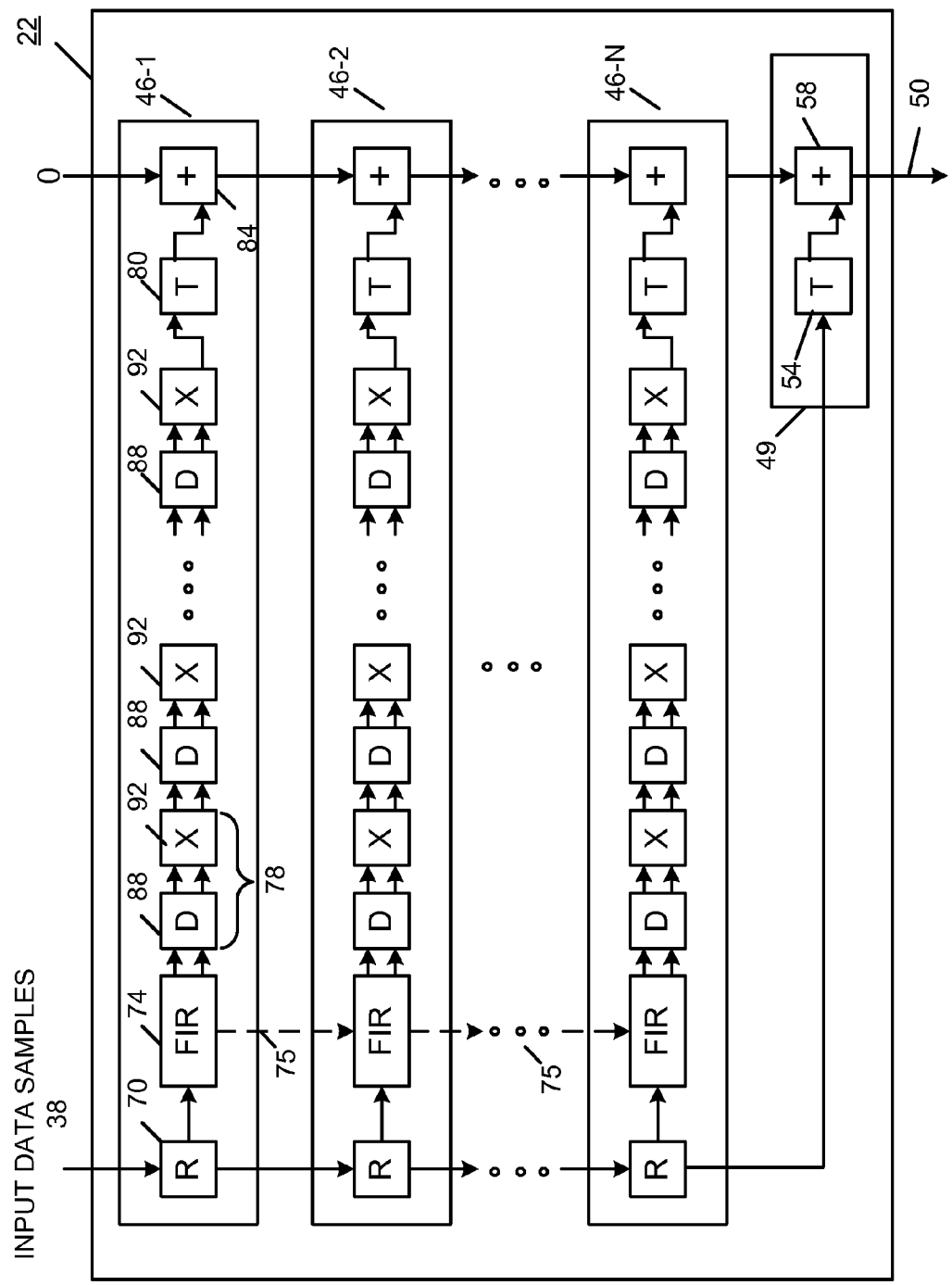
FIG. 2 is a functional block diagram of an embodiment of architecture for the systolic nonlinear filter of FIG. 1, including a plurality of polynomial nonlinear filters connected in a pipelined array fashion.

FIG. 2 shows an embodiment of the systolic nonlinear filter 22 including the plurality of polynomial nonlinear filters 46 in more detail. The systolic nonlinear filter 22 is representative of a class of polynomial nonlinear filters that consists of one or more individual nonlinear filters, each of which includes a finite impulse response (FIR) filter whose output is multiplied by delayed versions of the input. The basis of the architecture of the systolic nonlinear filter 22 is a highly regular, 2-dimensionally repeated processor module array structures that are well suited for VLSI implementation.

More specifically, each polynomial nonlinear filter 46 includes a plurality of pipelined modules including an input register module (R) 70, a finite impulse response (FIR) module 74, one or more delay-multiplication modules 78, a delay module 80, and an adder module 84. Each delay-multiplication module 78 includes a programmable delay (D) module 88 and a multiplication (X) module 92.

The input data samples 38 are distributed systolically to the input register module 70 of each multiple polynomial nonlinear filter 46. FIG. 3A shows an embodiment of the input register module 70 including an input terminal 100, a clocked register 102, and two output terminals 104-1, 104-2. One output terminal 104-1 is in communication with the input terminal 100 of the input register module 70 of the next polynomial nonlinear filter 46 in the pipelined array. The other output terminal 104-2 is in communication with an input terminal 110 (FIG. 3B) of the FIR module 74.

FIG. 3B shows an embodiment of the FIR module 74 including the input terminal 110, a clocked register 112, a FIR filter 114, and two output terminals 116-1, 116-2. The input terminal 110 receives an input data sample from the input register module 70. The input data sample passes to an input terminal of the FIR filter 114 and to the output terminal 116-1. The filtered results produced by the FIR filter 114, called a FIR-filtered data sample, passes to the output terminal 116-2.

In some embodiments, illustrated by reference numeral 75 in FIG. 2, the FIR filter 114 distributes the input data samples 38 systolically to the FIR filter 114 of the next multiple polynomial nonlinear filter 46 in the pipelined array.

Within each polynomial nonlinear filter 46, the FIR-filtered data sample is multiplied by delayed versions of the input data sample. These multiplications are performed in a systolic manner with replicated delay-multiplication modules 78. FIG. 3C shows an embodiment of a delay module 88, which is a time-tap sample delay. The delay module 88 includes two input terminals 120-1, 120-2, first and second clocked registers 124-1, 124-2, a programmable delay 126, and two output terminals 128-1, 128-2. FIG. 3D shows an embodiment of the multiplication module 92 including two input terminals 130-1, 130-2, first and second clocked registers 132-1, 132-2, a multiplier 134, a switch 136, and two output terminals 138-1, 138-2.

Input terminal 120-1 of the first delay module 88 in the pipeline of delay-multiplication modules 78 receives the unfiltered input data sample from the FIR module 74. The unfiltered input data sample resides in the clocked register 124-1 for a clock cycle, undergoes a delay in accordance with the programmable delay 126, and then passes to the output terminal 128-1. The output terminal 128-1 is in communication with the input terminal 130-1 of the multiplication module 92.

Within the multiplication module 92, the clocked register 132-1 holds the unfiltered delayed input data sample. In the next clock cycle, and the unfiltered delayed input data sample passes to an input terminal of the multiplier 134 and to the output terminal 138-1. Thus, the next delay module 88 in the delay-multiplication module pipeline receives a delayed version of the unfiltered input data sample. The delays within a polynomial nonlinear filter 46 are accumulative, enabling longer delays than producible with a single delay module.

The other input terminal 120-2 of the first delay module 88 in the pipeline receives the FIR-filtered data sample from the FIR module 74. After being held in the clocked register 124-2 for a clock cycle, the FIR-filtered data sample passes unaltered to the output terminal 128-2 and, thus, to the second input terminal 130-2 of the multiplication module 92. Within the multiplication module 92, the clocked register 132-2 holds the FIR-filtered data sample for a clock cycle. Then, the FIR-filtered data sample passes to a second input terminal of the multiplier 134. The multiplier 134 multiplies the delayed version of the unfiltered input data sample with the FIR-filtered version of the input data sample.

The switch 136 of the multiplication module 92 determines whether the product generated by the multiplier 134 passes to the second output terminal 138-2. When the switch 136 is in a first configuration (as shown), the output terminal 138-2 receives the multiplier results. When the switch 136 is in a second configuration (as indicated by the arced arrow) the FIR-filtered data sample passes unmodified from the input terminal 130-2 to the output terminal 138-2.

Accordingly, the switch 136 can be used to "bypass" the multiplication module 92 and to determine the polynomial order of the nonlinear filter 22. The greater the number of multiplication modules 92 in the pipeline with its switch 136 in the first configuration, the higher the polynomial order of the nonlinear filter 46; conversely, the fewer the number of multiplication modules 92 with its switch 136 in the first configuration, the lower the polynomial order.

An additional time-delay unit 80 (FIG. 2) receives the results—a FIR-filtered data sample multiplied by delayed version(s) of the input—produced by the last delay-multiplication module 78 in the delay-multiplication module pipeline. The time-delay unit 80 provides a mechanism for time adjusting the output of the polynomial nonlinear filter 46. Rather than being located at the end of the pipeline, the time-delay unit 80 can be disposed at the input of the polynomial nonlinear filter 46 (in the path of the FIR filter 114) and achieve equivalent functionality.

The output data samples produced by the polynomial nonlinear filters 46 are systolically summed. FIG. 3E shows an embodiment of the adder module 84 at the end of the pipeline of each polynomial nonlinear filter 46. The adder module 84 includes two input terminals 140-1, 140-2, first and second clocked registers 142-1, 142-2, an adder 144, and an output terminal 148. The first input terminal 140-1 receives the non-linearly filtered results produced by the polynomial nonlinear filter 46 from the input data sample. The clock register 142-1 holds these results. The second input terminal 140-2 receives an output data sample from a neighboring polynomial nonlinear filter 46 in the pipeline—the first polynomial nonlinear filter 46-1 being an exception; its second input terminal 140-2 receives a value of zero. The sum produced by the adder 144 passes to the output terminal 148. This sum represents the output data sample produced by the polynomial nonlinear filter 46.

Returning to FIG. 2, to provide nonlinear equalization, the equalization module 49 sums a delayed version of the input data sample with the systolically summed output data sample of the last polynomial nonlinear filter 46-n. The equalization module 49 includes a delay unit 54 and an adder module 58. The delay unit 54 receives and applies a delay to the input data sample before passing the input data sample to the adder 58. (The adder module 58 employs the same circuit layout as the adder modules 84 of the polynomial nonlinear filters 46). The delay unit 54 provides enough time delay to account for the processing delays of the polynomial nonlinear filters 46. The programmable delay ranges of the delay units 88, 54 can be varied to maximize the filter performance while minimizing hardware.

The architecture of the systolic nonlinear filter 22 is scaleable. For example, in order to increase the polynomial order of the individual filters 46, one increases the number of columns containing delay-multiplication modules 78. In order to increase the number of polynomial nonlinear terms, one includes additional polynomial nonlinear filters 46 systolically at the bottom of the filter 22.

As illustrated, the entire nonlinear filter architecture is based on 1-dimensional and 2-dimensional replication of simple identical processing modules. This type of architecture is well suited for high performance IC implementation because the small identical processing modules can be optimized for small die size, high clock rate, and low power. The structure of the entire nonlinear filter 22 can be generated by simple replications with a computer aided design (CAD) tool.

Figure 4A:
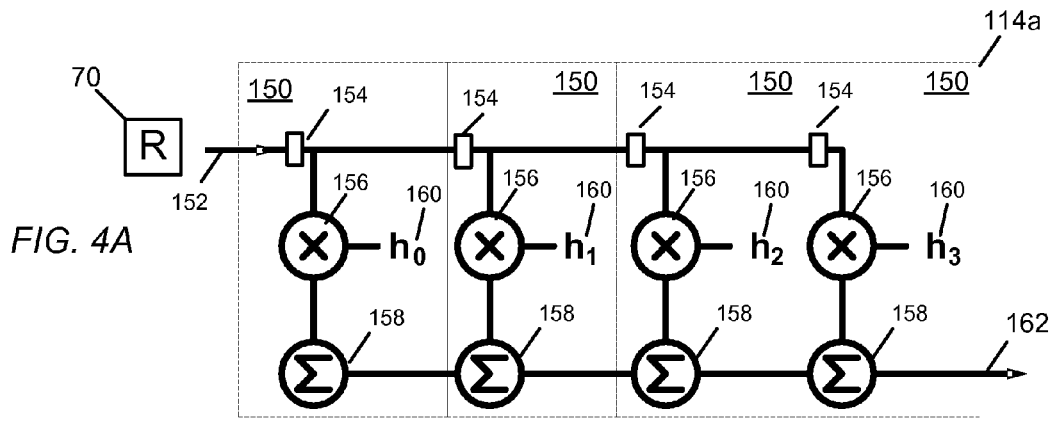
FIG. 4A, FIG. 4B, and FIG. 4C are different embodiments of finite impulse response (FIR) filters that can be used in the implementation of the polynomial nonlinear filters of FIG. 2.
Figure 4B:
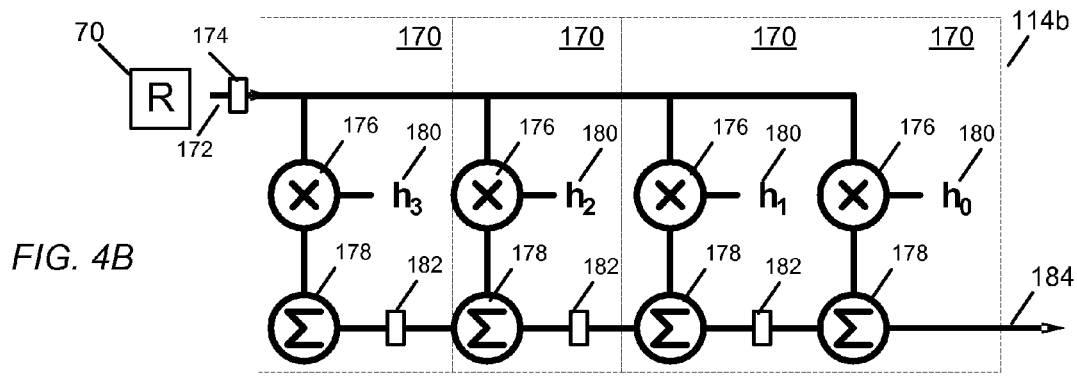
Figure 4C:
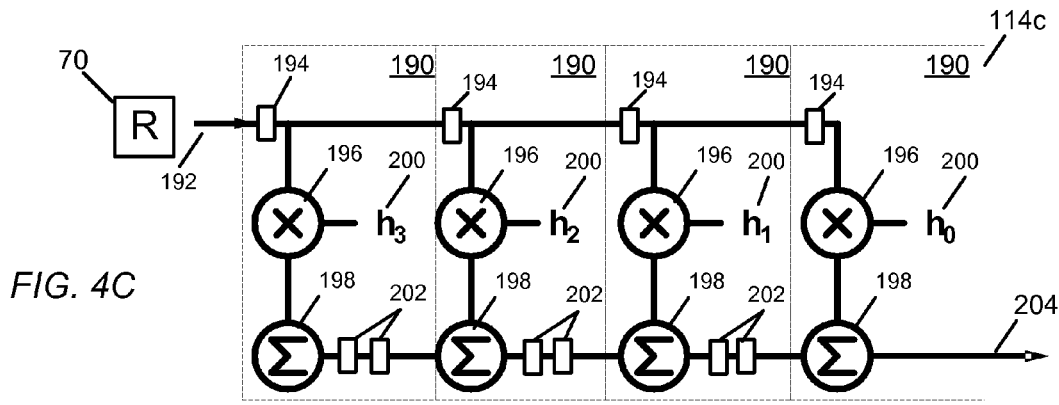

FIG. 4A, FIG. 4B, and FIG. 4C illustrate different embodiments of architecture for FIR filters 114. In general, a FIR filter can include delays, clocked registers, multipliers, and adders that cooperate to produce FIR-filter output data. The FIR filters illustrated in FIG. 4A, FIG. 4B, and FIG. 4C are exemplary; other FIR filter architectures can be used in the practice of the invention. FIG. 4A shows an embodiment of architecture for a non-transposed FIR filter 114a. The FIR filter 114a includes a series of stages or taps 150 (here, four), an input terminal 152 for conveying input data from the input register module 70, and an output terminal 162 for conveying the output data produced by the FIR filter 114a. Each tap 150 includes a clocked register 154, a multiplier 156, and an adder 158.

On successive clock cycles, the input data sample arriving on input line 152 propagates to the multiplier 156 of each tap 150 (i.e., four clock cycles for the input data sample to reach the multiplier 156 of the last tap). Each multiplier 156 multiplies the input data by a coefficient 160 (here, the taps use h0, h1, h2, and h3, respectively). The result produced by a given multiplier 156 passes to the adder 158 of the same tap 150 as that multiplier 156. Each adder 158 produces a sum that passes to the neighboring tap 150 (except for the adder in the last tap in the series, which produces the FIR-filter output data 162). Generally, the filtering behavior of a FIR filter depends on the length of the filter (i.e., number of taps) and values of the coefficients. In this example, the FIR-filter output data 162 is a function of four samples of input data.

FIG. 4B shows an embodiment of architecture for a transposed FIR filter 114b. The FIR filter 114b includes a series of four taps 170, an input terminal 172 for conveying input data from the input register module 70, a first clocked register 174, and an output terminal 182 for conveying the output data produced by the FIR filter 114b. Upon each clock cycle, an input data sample passes concurrently to each of the four taps 170. Each tap 170 includes a multiplier 176 and an adder 178. Each multiplier 176 multiplies the input data by a coefficient 180 (here, h3, h2, h1, and h0, respectively). The results produced by a given multiplier 176 passes to the adder 178 of the same tap 170. Each adder 178 produces a sum that passes to a clocked register 182 before passing to the neighboring tap 170 (except for the adder in the last tap in the series, which produces the FIR-filter output data 184).

FIG. 4C shows an embodiment of architecture for a systolic FIR filter 114c. The systolic FIR filter 114c includes a series of four taps 190, an input terminal 192 for conveying input data from the input register module 70, and an output terminal 204 for conveying the output data produced by the FIR filter 114c. Each tap 190 includes a clocked register 194, a multiplier 196, and an adder 198. The input clock register 194 is disposed in the path of the input terminal 192 between the register module 70 and the multiplier 196.

Each multiplier 196 multiplies the input data sample by a coefficient 200 (here, h3, h2, h1, and h0, respectively). The result produced by a given multiplier 196 passes to the adder 198 of the same tap 190. The sum produced by the adder 198 passes through a pair of clocked registers 202 (i.e., two clock cycles) before passing to the neighboring tap 190 (except for the adder in the last tap in the series, which produces the FIR-filter output data 204).

Figure 5:
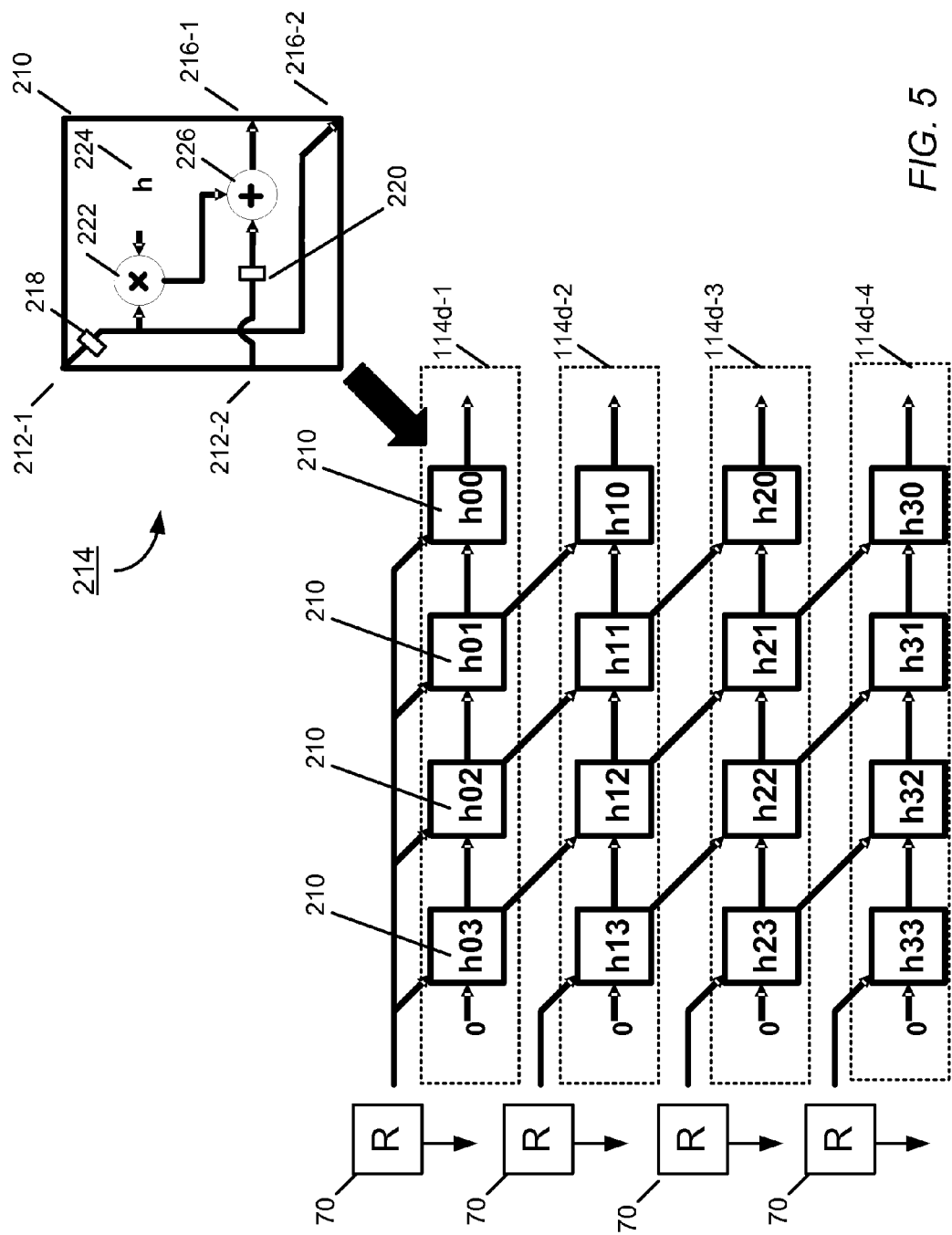
FIG. 5 is a functional block diagram of architecture for stacked systolic FIR filters that can be used in the implementation of the polynomial nonlinear filters of FIG. 2.

FIG. 5 shows an embodiment of architecture for stacked systolic FIR filters (also called a stacked FIR filter array). In this example, the stacked FIR filters includes FIR filter 114d-1, 114d-2, 114d-3, 114d-4 (generally, 114d). Each FIR filter 114d is a component of a FIR module 74 (FIG. 3B) of a polynomial nonlinear filter 46 (FIG. 2); for example, FIR filter 114d-1 is in the polynomial nonlinear filter 46-1 and FIR filter 114d-n is in the polynomial nonlinear filter 46-n. Although described herein with respect to nonlinear filtering applications, the stacked FIR filter array can also be used in linear filtering applications.

In this example, each FIR filter 114d has four taps 210 (also called computational units). Each of the first three taps 210 of the first three FIR filters 114d-1, 114d-2, and 114d-3 is connected to the tap 210 located in the next "downstream" column and row.

For example, the first tap (h03 coefficient) of the first FIR filter 114d-1 is in communication with the second tap (h12) of the second FIR filter 114d-2; the second tap (h02) of the first FIR filter 114d-1 is in communication with the third tap (h11) of the second FIR filter 114d-2; and the third tap (h01) of the first FIR filter 114d-1 is in communication with the fourth tap (h10) of the second FIR filter 114d-2. This pattern repeats for communications between the second and third FIR filters 114d-2, 114d-3, and between the third and fourth FIR filters 114d-3, 114d-4.

Over these communication paths, input data flow systolically and vertically from the top FIR filter 114*d*-1 of the top polynomial nonlinear filter 46-1 to the bottom FIR filter 114-4 of the last polynomial nonlinear filter 46-*n*. This architecture advantageously simplifies input data routing.

In general, each tap 210 includes circuitry for multiplying an input data sample by a coefficient (predetermined or dynamically determined) and summing the multiplication results with the computed results of a previous tap. The FIR filters 114*d* perform linear filtering, with the values of the various coefficients determining the impulse response. In the illustrated example of the stacked FIR filters, each tap 210 multiplies the input data with a different coefficient.

The insert 214 shows an example embodiment of a tap 210, hereafter referred to as a computational unit 210. The computational unit 210 includes a pair of input terminals 212-1, 212-2, a pair of output terminals 216-1, 216-2, a first clocked register 218, a second clocked register 220, a multiplier 222, a coefficient 224, and an adder 226.

The input terminal 212-1 receives input data either from a register module 70 or from a computational unit 210 of a neighboring FIR filter 114*d*. The input terminal 212-2 receives the sum produced by the neighboring upstream computational unit 210, if any, in the same FIR filter; otherwise, the input terminal 212-2 receives a value of zero. The first clocked register 218 resides in the path between the input terminal 212-1 and the multiplier 222. The second clocked register 218 resides in the path between the input terminal 212-2 and the adder 226.

The product of the input data sample and a coefficient 224 passes from the multiplier 222 to the adder 226. The sum produced by the adder 226 passes to the output terminal 216-1 (and from there to the neighboring downstream computational unit 210, if any, in the same FIR filter; otherwise to a delay module 88 (FIG. 3C)). The output terminal 216-2 receives the input data received by the input terminal 212-1 (and delayed by the first clock register 218).

Figure 6A:
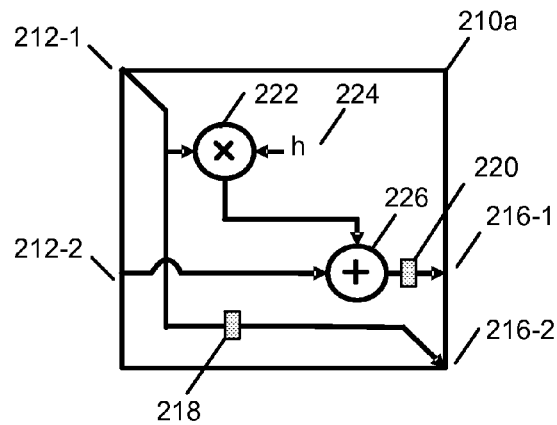
FIG. 6A, FIG. 6B, and FIG. 6C are additional different embodiments of computational units that can be used to implement the stacked systolic FIR filters of FIG. 5.
Figure 6B:
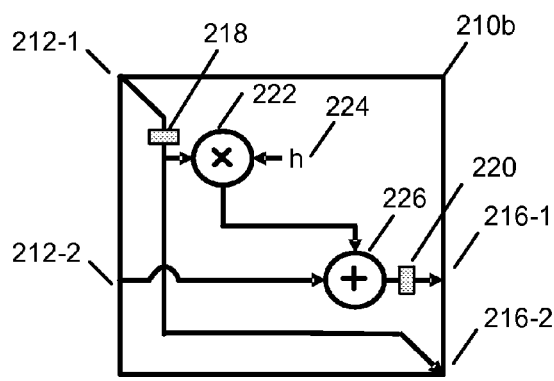
Figure 6C:
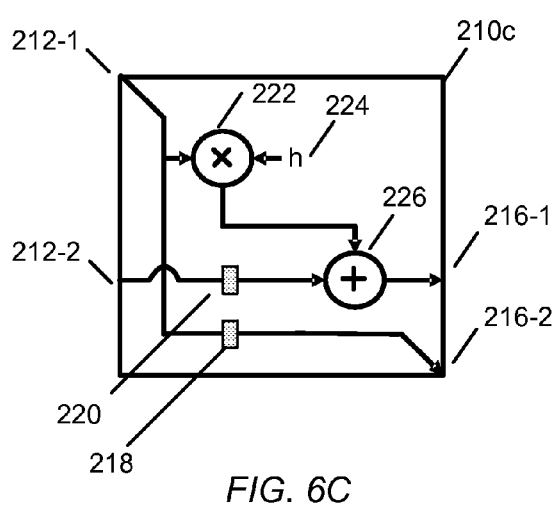

FIG. 6A, FIG. 6B, and FIG. 6C are different embodiments of computational units 210*a*, 210*b*, 210*c* that may be used to implement the stacked systolic FIR filters of FIG. 5. In general, the embodiments differ from each other and from the embodiment shown in FIG. 5 in the placement of the first and second clock registers 218, 220.

In FIG. 6A, the first clock register 218 is disposed after the input terminal to the multiplier 222 (thus, upon being received by the input terminal 212-1, the input data sample passes directly to the input terminal of the multiplier 222). The second clock register 220 is disposed between the adder 226 and the output terminal 216-1. In FIG. 6B, the first clock register 218 is disposed before the input terminal of the multiplier 222 and the second clock register 220 is disposed between the adder 226 and the output terminal 216-1; and in FIG. 6C, the first clock register 218 is disposed after the input terminal of the multiplier 222 and the second clock register 220 is disposed between the input terminal 212-1 and the adder 226.

The computational units shown in FIGS. 5, 6A, 6B, and 6C have equivalent systolic architectures. Computational units 210 of stacked FIR filters are all of the same type; that is, whichever embodiment of computational unit is used, each computational unit in the stacked FIR filter employs that same systolic architecture.

An advantage arising from this architecture is that the layout of logic or circuitry of each computational unit 210 is repeatable; that is, a structured layout "cell" of gates and other logic structures for implementing the functionality of one computational unit can be used to produce an array of such computational units. This repeatability simplifies the design and construction of an ASIC device, for example, that implements the nonlinear filter processor 10 of the invention.

For any embodiment of computational unit 210, the multipliers and adders can be pipelined at various levels and still have functionally equivalent systolic architecture. That is, arithmetic computations may require multiple array clock cycles, and the computational units 210 can be retimed similarly to accommodate the multiple cycles. In such embodiments, the latency of each computational unit 210 is equal to multiple array clock cycles. Notwithstanding the multiple-clock-cycle latency of the computational modules, the operation of the stacked FIR filter array remains unaffected (i.e., the type of computations, direction of flow of input data samples and of computed values across the array) and still achieves the same data throughput rate.

The communication of input data samples and delays can also be "pipelined" so that computational throughput can be increased without affecting stacked FIR filter array operation. In this case, the output latency of the FIR filter array increases by a number of array clock cycles (in comparison to the embodiments of FIR filter arrays described in FIG. 5, FIG. 6A, FIG. 6B, and FIG. 6C, in which the latency of each computational unit 210 is one array clock cycle). In addition, any of the various processing modules 70, 74, 84, 88, and 92 can be retimed.

Polyphase FIR and Polynomial Nonlinear Filters

In some signal-processing applications, the data rate required for the nonlinear filter is so high that the computational units cannot keep up with the data rate. In other signal-processing applications, high-speed circuitry is able to keep up with the data rate, but consumes too much power. In these instances, it is desirable to de-multiplex the digital input data into multiple "phases" and perform operations at lower clock speed.

In brief, the demultiplexor 18 (FIG. 1) or the data acquisition module 26 (FIG. 1) de-multiplexes the input data into K-phases with each phase requiring a clock speed of 1/K of the original clock speed. For example, if input data X are de-multiplexed into K phases, the input data $X(0), X(1), \ldots, X(K-1)$ enter the nonlinear filter 22 on the first clock cycle, and input data $X(K), X(K+1), \ldots, X(2K-1)$ enter on the second clock cycle, and so on. The de-multiplexed input data are distributed to the phases in a round robin basis. The output produced by the nonlinear filter is similarly de-multiplexed.

Figure 7:
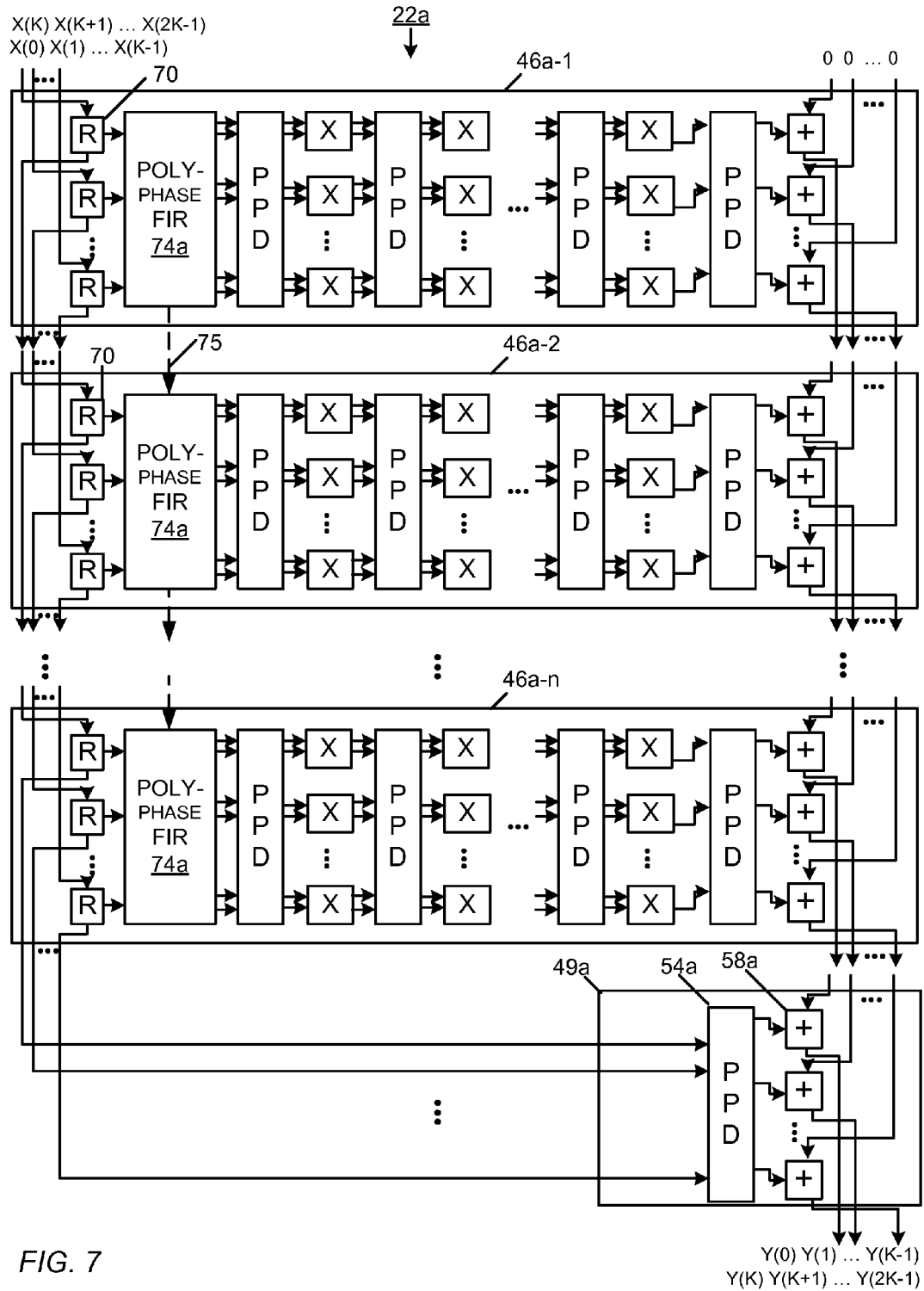
FIG. 7 is a functional block diagram of architecture for an embodiment of a stacked polyphase systolic polynomial nonlinear filter.

FIG. 7 shows an embodiment of architecture for a systolic polyphase nonlinear filter 22*a* including a plurality of stacked polyphase systolic polynomial nonlinear filters 46*a*-1, 46*a*-2, 46*a*-*n* (generally, 46*a*). The general systolic architecture of the nonlinear filter 22*a* is similar to the architecture of the nonlinear filter 22 shown in FIG. 2, except that each polynomial nonlinear filter 46*a* is as shown in FIG. 8.

Figure 8:
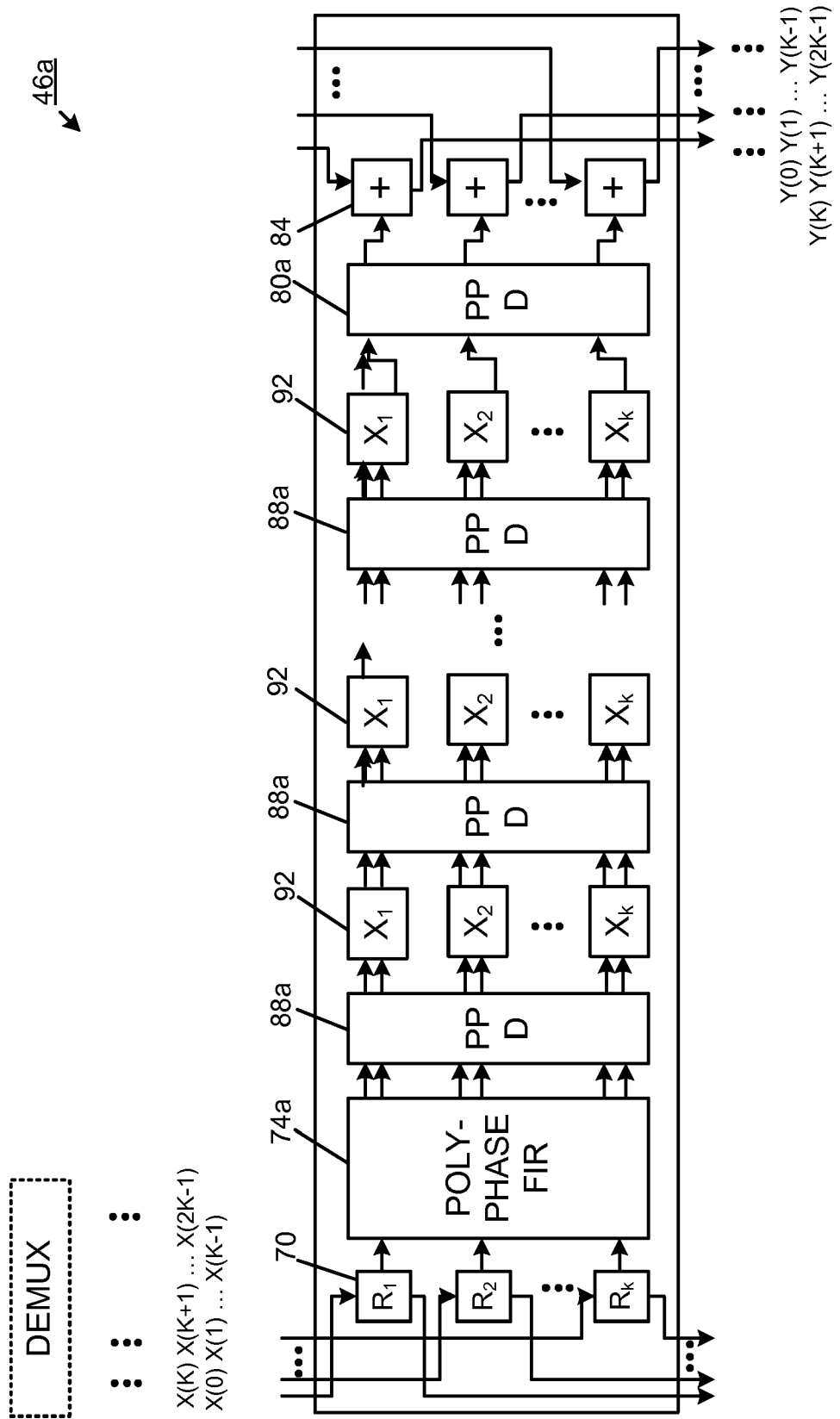
FIG. 8 is a functional block diagram of architecture for an embodiment of a single polyphase systolic polynomial nonlinear filter.

Referring to FIG. 8, each polynomial nonlinear filter 46*a* includes a plurality of input register modules (R) 70, a polyphase FIR module 74*a*, a series of polyphase delay (PPD) module 88*a*/multiplier (X) modules 92, a polyphase delay (PPD) module 80*a*, and a plurality of adder modules 84. The number of register modules 70, multiplier modules 92, and adder modules 84 correspond to the number of phases implemented by the polyphase polynomial nonlinear filter 46.

Referring back to FIG. 7, the input data arriving at the first polyphase polynomial nonlinear filter 46*a*-1 are de-multiplexed into K-phases. For example, during a first clock cycle, K input data samples, identified as $X(0), X(1), \ldots, X(K-1)$, are distributed to the K register modules 70 of the first polyphase polynomial nonlinear filter 46*a*-1. Each register module 70 receives one of the input data samples. During a second clock cycle, K input data samples, identified as X(K), X(K+1), . . . , X(2K−1), are distributed to the K register modules 70. Accordingly, over successive clock cycles, a series of input data samples identified as X(0), X(K), X(2K), . . . pass to a first register module, input data samples identified as X(1), X(K+1), X(2K+1), . . . pass to a second register module, and input data samples identified as X(K−1), X(2K−1), X(3K−1), . . . pass to the Kth register module. Each register module 70 passes its input data samples to a different phase of the polyphase FIR module 74a. In addition, each register module 70 passes its input data samples to a different, corresponding register module 70 in the next polyphase polynomial nonlinear filter 46a-2.

The polyphase FIR filter 74a produces multiple phase outputs, which pass to a first polyphase delay module 88a. In order to provide the polyphase time delay, the polyphase delay module 88 shifts the input data to different output terminals with appropriate sample delays depending on the time delays required. For example, consider that at time 0 four input samples X0(0), X1(0), X2(0), and X3(0) arrive from the polyphase FIR module 74a concurrently at the polyphase delay module 88a. Each input data sample arrives at a different input terminal of the polyphase delay module 88a (i.e., each sample belonging to a different phase). Consider also that the polyphase delay module 88a is programmed to produce a delay of one phase, which, in this example, is equivalent to one ADC sample delay. To achieve this one-phase delay, the polyphase delay module 88a shifts each input data to an output terminal corresponding to the appropriate phase for that input data. In this example, the shift effectively causes X0(0) to become X1(0), X1(0) to become X2(0), X2(0) to become X3(0), and X3(0) to become X0(1). The multiplication modules 92 multiply these multiple phase outputs with the time-delayed versions of the FIR-filtered input data provided by polyphase delay module 88.

Figure 9:
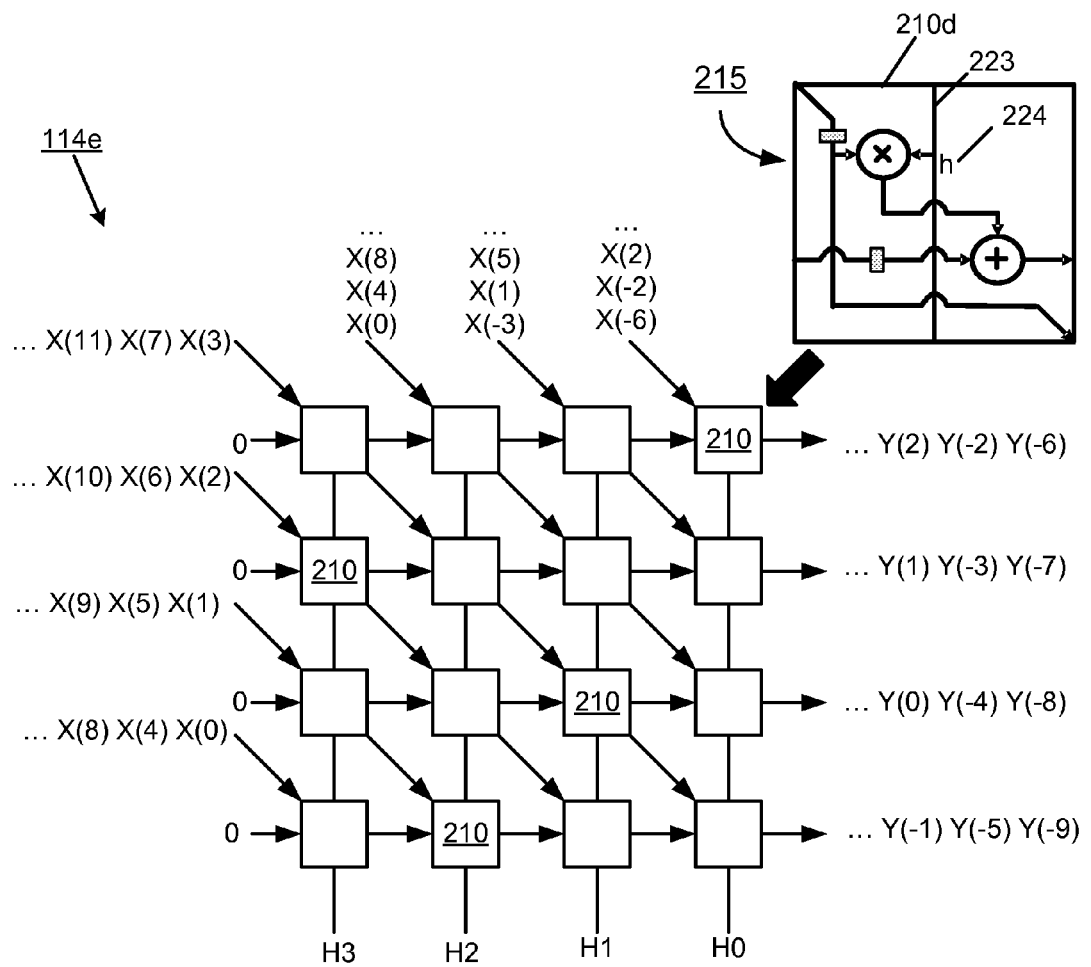
FIG. 9 is a functional block diagram of architecture for an embodiment of a systolic polyphase FIR filter that can be used to implement the stacked polyphase systolic polynomial nonlinear filter of FIG. 7.

For efficient implementations of the polyphase nonlinear filters 46a, the polyphase FIR filters can be systolic polyphase FIR filters. FIG. 9 shows an embodiment of architecture for an unstacked systolic polyphase FIR filter 114e for receiving de-multiplexed input data and producing de-multiplexed output data. In the systolic polyphase FIR filter 114e, the computational units 210 are arranged in an array comprised of columns and rows. Each column corresponds to a different tap of the FIR filter 114e and each row corresponds to a different phase.

The systolic polyphase FIR filter 114e comprises identical computational units 210. Each of such computational units 210 communicates with nearest neighbor computational units only. Insert 215 shows an example embodiment of a computational unit 210d. the computational unit 210d is architecturally similar to the computational unit 210 shown and described in FIG. 5, with an exception that the computational unit 210d has a signal line 223 for conveying the coefficient 224 to an input terminal of the multiplier 222. This signal line 223 conveys the coefficient to the nearest neighbor in a previous row, if any, and in a subsequent row, if any, within the same column. Accordingly, all computational units 210 in the same column use the same coefficient, although different columns may use different coefficients.

FIG. 10A, FIG. 10B, and FIG. 10C illustrate alternative retimed embodiments of the computational unit 210d. The computational units 210e, 210f, and 210g shown in FIG. 10A, FIG. 10B, and FIG. 10C have equivalent systolic architectures. The embodiments of computational units 210e, 210f, 210g are similar to corresponding embodiments 210a, 210b, 210c shown in FIG. 6A, FIG. 6B, and FIG. 6C, except that the computational units 210e, 210f, 210g have a coefficient signal line 223 for communicating with neighboring computational units in another phase of the FIR filter 114e. Other embodiments of computational units than those described can be used to implement the systolic polyphase FIR filter 114e.

The computational units of the systolic polyphase FIR filter 114e are all of the same type; that is, whichever embodiment of computational unit is used, each computational unit in the systolic polyphase FIR filter 114e employs that same architecture. In addition, for nonlinear filters 22 comprised of an array of multiple stacked polynomial nonlinear filters, the polyphase FIR filters 114e of those polynomial nonlinear filters employ the same embodiment of computational unit.

The performance of the polyphase FIR filter 114e can be readily altered by adding or removing columns or rows of computational units. Adding or removing rows affects the extent to which the incoming data samples can be de-multiplexed, and, thus, the degree to which the array clock speed of the nonlinear filter processor 10 can be reduced and still achieve an output data rate equal to the input data rate. Adding or removing columns can affect the performance of each FIR filter's impulse response (i.e., the number of input data samples and coefficients that are involved in producing an output data sample).

Figure 11:
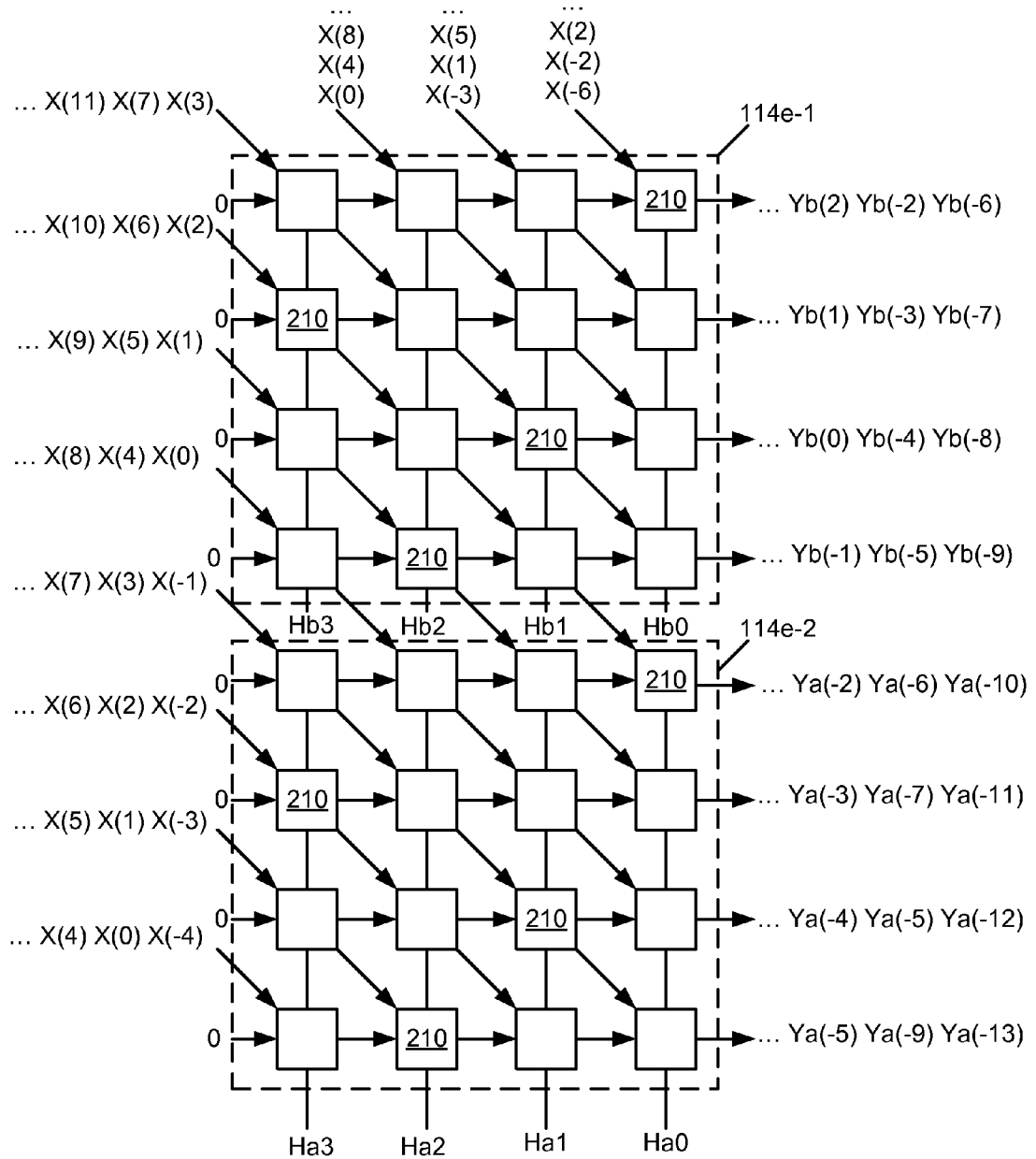
FIG. 11 is a functional block diagram of architecture for stacked systolic polyphase FIR filters that can be used to implement the stacked systolic polynomial nonlinear filter of FIG. 7.

FIG. 11 shows an embodiment of architecture for a stacked systolic polyphase FIR filter including a first systolic polyphase FIR filter 114e-1 connected vertically to a second systolic polyphase FIR filter 114e-2. Each systolic polyphase FIR filter 114e-1, 114e-2 is employed in one of the vertically stacked polyphase polynomial nonlinear filters 46a. Although only two systolic polyphase FIR filters 114e-1, 114e-2 are shown—to simplify the illustration—stacked polyphase polynomial nonlinear filters can have more than two stacked polyphase FIR filters.

For example, a nonlinear filter 22 with four vertically stacked polyphase polynomial nonlinear filters 46a can have four vertically stacked systolic polyphase FIR filters 114e. These four polyphase FIR filters 114e systolically propagate, in four successive clock cycles, the input data from the top FIR filter, to the second FIR filter, then to the third FIR filter, and then to the bottom FIR filter.

This architecture is highly suited for high data rate implementations. Implementations of unstacked and stacked systolic polyphase FIR filters and of computational units that may be used to construct such polyphase FIR filters are described in U.S. patent application Ser. No. 10/993,076, filed Nov. 19, 2004, titled "Systolic De-Multiplexed Finite Impulse Response Filter Array Architecture for Linear and Non-Linear Implementations," the entirety of which patent application is incorporated by reference herein.

An advantage of the systolic polyphase nonlinear filter array architecture is that the nonlinear filter can support data rates much higher than the processor clock speed. The architecture can also be used to slow down the required clock speed. A slower processor clock speed often allows circuit designs that achieve greater power efficiency than high clock speed designs. The proposed architecture also lends itself to efficient chip-level implementations with regular structure and nearest neighbor communications.

Figure 12:
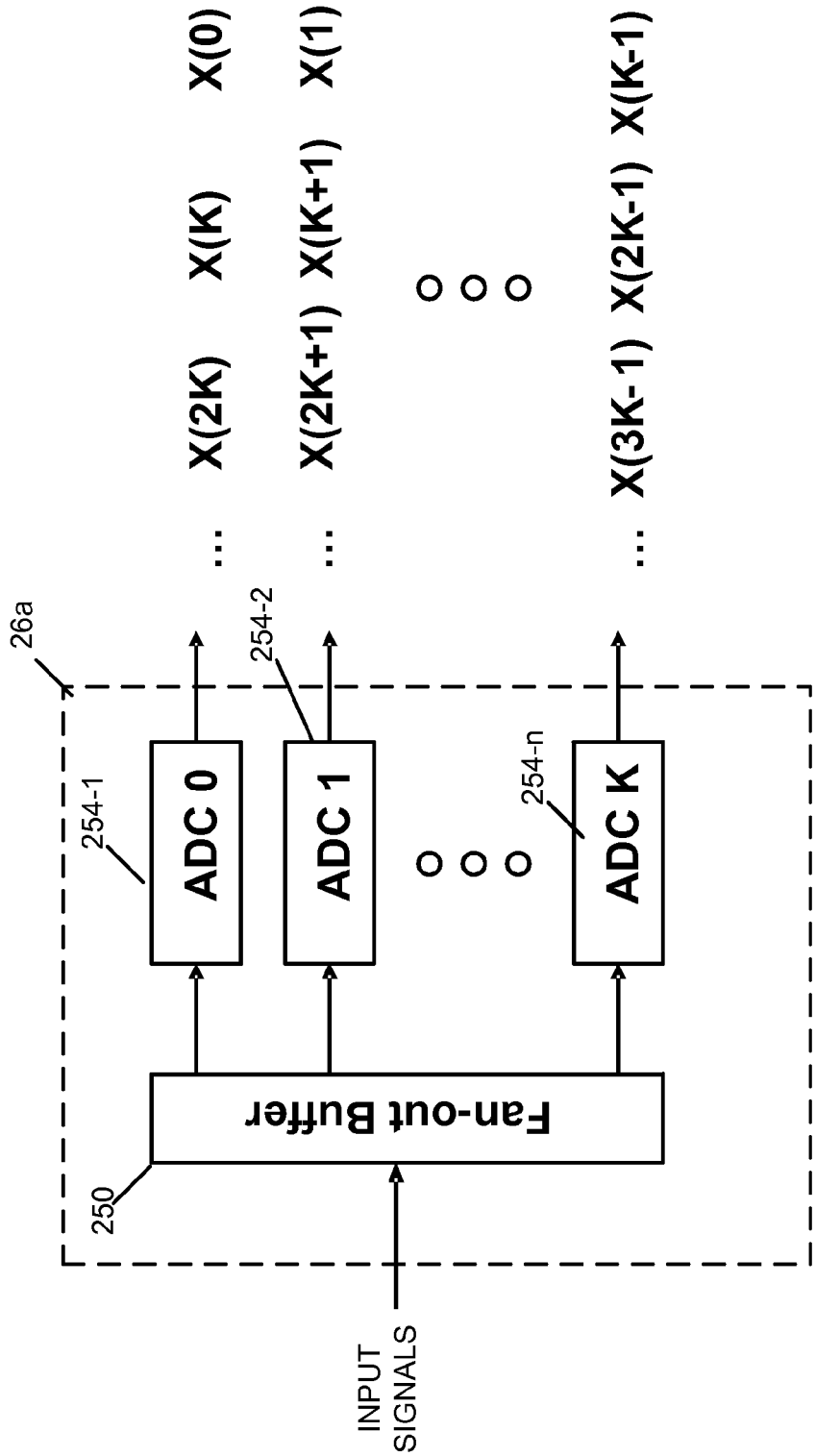
FIG. 12 is a functional block diagram of an embodiment of time-interlaced analog-to-digital converters (ADC) for providing input data samples to the nonlinear filter of the present invention.

To sample signals at high speeds with large dynamic range, multiple ADCs interlaced in time may be used. FIG. 12 shows an embodiment of time-interlaced ADCs for providing de-multiplexed input data to the nonlinear filter 22a of FIG. 7. In FIG. 12, an embodiment of the data acquisition module 26a includes a fan-out buffer 250 and K ADCs 254. The fan-out buffer 250 sends received input signals to the ADCs 254 in round robin fashion to implement time interlaced sampling. The collective sampling rate of the interlaced ADCs 254 is K times faster than the sampling rate of each ADC individually. The sampling times of the ADCs are offset uniformly to provide continuous sampling in time with a uniform sampling interval.

Because each ADC 254 generally has slightly different nonlinearities, overall linearity would improve if the nonlinear filter characteristics could adjust for these differences. For the nonlinear filter 22*a* shown in FIG. 7, the output produced by each ADC corresponds to a different phase input to the polyphase FIR filter 74*a*. By providing different FIR filter coefficients for each phase input, the nonlinear filter 22*a* can produce a different customized nonlinear response for each time-interlaced ADC 254.

Figure 13:
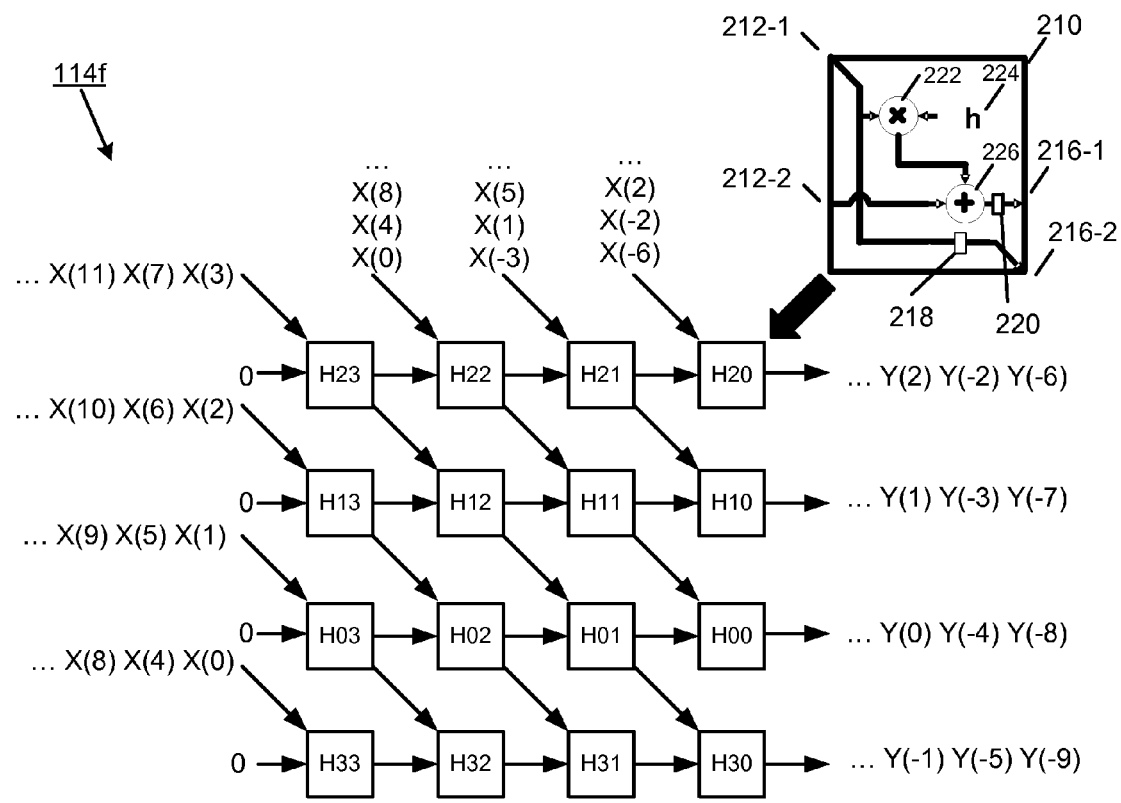
FIG. 13 is a functional block diagram of an embodiment of architecture for a systolic polyphase FIR filter for receiving input data samples from the time-interlaced ADCs of FIG. 12.

FIG. 13 shows an exemplary implementation of a non-transposed polyphase FIR filter 114*f* for receiving input data samples from the time-interlaced ADCs of FIG. 12. Instead of having the same coefficients for all phases, such as the embodiment described in FIG. 9, the output data of each phase are computed with coefficients unique to that phase. As illustrative examples, the output data of phase 0, identified as Y(0), Y(−4), and Y(−8), are computed with coefficients H00, H01, H02, and H03. The phase 1 output data Y(1), Y(−3), Y(−7) are computed with coefficients H10, H11, H12, and H13. With unique FIR coefficients, the input data provided by each ADC 154 can be adjusted by different unique nonlinear filter characteristics optimized for the nonlinearities of that particular ADC 154, thereby improving higher linearity performance. To support time-interlaced ADCs 154, the polyphase FIR filter 114*f* substitutes for each polyphase FIR 114*e* used in the embodiments described in FIG. 7, FIG. 8, and FIG. 11.

While the invention has been shown and described with reference to specific preferred embodiments, it should be understood by those skilled in the art that various changes in form and detail may be made therein without departing from the spirit and scope of the invention as defined by the following claims.

What is claimed is:

1. A systolic polynomial nonlinear filter, comprising:
a clocked register for receiving an input data sample;
a finite impulse response (FIR) module receiving the input data sample from the clocked register, the FIR module having a FIR filter for producing a FIR-filtered data sample from the input data sample; and
a pipeline of clocked delay-multiplication modules including a first delay-multiplication module in communication with the FIR module to receive the input data sample and the FIR-filtered data sample, the first delay-multiplication module having a delay module in communication with a multiplication module, the delay module having a first input terminal for receiving the input data sample from the FIR module, a second input terminal for receiving the FIR-filtered data sample from the FIR module, and a programmable delay circuit for delaying the input data sample, the multiplication module having a first input terminal for receiving the delayed input data sample from the delay module, a second input terminal for receiving the FIR-filtered data sample from the delay module, and a multiplier for multiplying the delayed input data sample with the FIR-filtered data sample.

2. The systolic polynomial nonlinear filter of claim 1, wherein the FIR filter includes a plurality of phases.

3. The systolic polynomial nonlinear filter of claim 2, wherein each phase of the FIR filter includes a plurality of pipelined computational units, wherein the input data sample passes from at least one computational unit in a first phase to a computational unit in a neighboring second phase.

4. The systolic polynomial nonlinear filter of claim 2, further comprising a plurality of time-interlaced analog-to-digital converters (ADCs), each ADC receiving a different series of de-multiplexed input signals, converting the received input signals to input data samples, and forwarding the input data samples to a different one of the phases of the FIR filter.

5. The systolic polynomial nonlinear filter of claim 1, wherein the FIR filter is a transposed FIR filter.

6. The systolic polynomial nonlinear filter of claim 1, wherein the FIR filter is a non-transposed FIR filter.

7. The systolic polynomial nonlinear filter of claim 1, further comprising an adder module.

8. The systolic polynomial nonlinear filter of claim 1, further comprising a delay module disposed in a path of the FIR filter.

9. The systolic polynomial nonlinear filter of claim 1, wherein the multiplication module has a configurable bypass mechanism for passing the FIR-filtered data sample through the multiplication module without multiplication.

10. A nonlinear filter processor, comprising:
an array of polynomial nonlinear filters including a first polynomial nonlinear filter and a last polynomial nonlinear filter, the first polynomial nonlinear filter having an input terminal for receiving an input data sample, the polynomial nonlinear filters systolically passing the input data sample from the first polynomial nonlinear filter to the last polynomial nonlinear filter, each polynomial nonlinear filter producing an output data sample based on the input data sample, each polynomial nonlinear filter other than the last polynomial nonlinear filter systolically passing the output data sample generated by that polynomial nonlinear filter to a neighboring polynomial nonlinear filter, and each polynomial nonlinear filter other than the first polynomial nonlinear filter summing a nonlinearly filtered input data sample produced by that polynomial nonlinear filter with the output data sample received from a neighboring polynomial nonlinear filter.

11. The nonlinear filter processor of claim 10, wherein each polynomial nonlinear filter includes a finite impulse response (FIR) module having an input terminal for receiving the input data sample, first and second output terminals, and a FIR filter, the FIR filter receiving the input data sample and producing a FIR-filtered data sample therefrom, the first output terminal carrying the input data sample received on the input terminal and the second output terminal carrying the FIR-filtered data sample produced by the FIR filter.

12. The nonlinear filter processor of claim 11, wherein each FIR filter includes a plurality of identical taps arranged in a systolic pipeline, wherein each tap of the FIR filter of the first polynomial nonlinear filter, other than the last tap in the systolic pipeline, systolically passes the input data sample to a neighboring tap of the FIR filter of a neighboring polynomial nonlinear filter.

13. The nonlinear filter processor of claim 11, wherein each FIR filter is a polyphase FIR filter having a plurality of phases, each phase including a plurality of identical taps arranged in a pipeline.

14. The nonlinear filter processor of claim 13, further comprising a plurality of time-interlaced analog-to-digital converters (ADCs), each ADC receiving a different series of de-multiplexed input signals, converting the received input signals to input data samples, and forwarding the input data samples to a different one of the phases of the FIR filter of the first polynomial nonlinear filter.

15. The nonlinear filter processor of claim 13, wherein each polyphase FIR filter includes a first phase and a last phase, each phase including a plurality of pipelined taps, and wherein each tap in the last phase of the polyphase FIR filter of the first polynomial nonlinear filter, other than the last tap in the pipeline of the last phase, communicates with a neighboring tap in a first phase of the polyphase FIR filter of a neighboring polynomial nonlinear filter.

16. The nonlinear filter processor of claim 11, wherein each FIR filter is a transposed FIR filter.

17. The nonlinear filter processor of claim 11, wherein each FIR filter is a non-transposed FIR filter.

18. The nonlinear filter processor of claim 11, wherein each polynomial nonlinear filter further comprises:
  a systolic pipeline of delay-multiplication modules including a first delay-multiplication module in communication with the FIR module of that polynomial nonlinear filter, the first delay-multiplication module of each polynomial nonlinear filter including a delay module in communication with a multiplication module, the delay module having a first input terminal for receiving the input data sample from the FIR module of that polynomial nonlinear filter, a second input terminal for receiving the FIR-filtered data sample from the FIR filter of that FIR module, and a programmable delay for delaying the input data sample, the multiplication module having a first input terminal for receiving the delayed input data sample from the delay module, a second input terminal for receiving the FIR-filtered data sample from the delay module, and a multiplier for multiplying the delayed input data sample with the FIR-filtered data sample.

19. The nonlinear filter processor of claim 18, wherein each multiplication module has a configurable bypass mechanism for passing the FIR-filtered data sample through that multiplication module without multiplication.

20. The nonlinear filter processor of claim 10, further comprising an equalization module including a delay module for delaying the input data sample systolically received from the last polynomial nonlinear filter and an adder module for adding the delayed input data sample to an output data sample received from the last polynomial nonlinear filter.

21. A stacked filter, comprising an array of finite impulse response (FIR) filters including a first FIR filter and a second FIR filter, each FIR filter having a plurality of taps arranged in a pipeline including a first tap, a last tap, and zero or more intermediate taps, each tap other than the last tap in the pipeline of the first FIR filter being in communication with one of the taps in the second FIR filter, wherein each tap of the first FIR filter concurrently receives an input data sample during a first clock cycle and each tap other than the last tap in the pipeline of the first FIR filter systolically passes the input data sample to one of the taps of the second FIR filter during a second clock cycle.

22. The stacked filter of claim 21, wherein each tap other than the last tap in the systolic pipeline of the first FIR filter is in communication with the tap of the second FIR filter in a next row and next column with respect to that tap.

23. The stacked filter of claim 21, wherein the taps have identical circuit architecture.

24. The stacked filter of claim 21, wherein each FIR filter is systolic.

25. The stacked filter of claim 21, wherein each tap employs a different coefficient with which to multiply the input data sample.

26. A method for filtering an input data sample, the method comprising:
  arranging a plurality of polynomial nonlinear filters in a pipelined array having a first polynomial nonlinear filter, a last polynomial nonlinear filter, and zero or more intermediate polynomial nonlinear filters;
  systolically distributing the input data sample to each polynomial nonlinear filter in the pipelined array;
  producing, by each polynomial nonlinear filter, a nonlinearly filtered data sample based on the input data sample and an output data sample based on that nonlinearly filtered data sample;
  passing, by each polynomial nonlinear filter other than the last polynomial nonlinear filter in the pipelined array, the output data sample produced by that polynomial nonlinear filter to a neighboring polynomial nonlinear filter; and
  summing, by each polynomial nonlinear filter other than the first polynomial nonlinear filter, the nonlinearly filtered data sample produced by that polynomial nonlinear filter with the output data sample received from a neighboring polynomial nonlinear filter, thereby generating the output data sample produced by that polynomial nonlinear filter.

27. The method of claim 26, further comprising the step of adding a delayed input data sample to the output data sample produced by the last polynomial nonlinear filter in the pipelined array.

28. The method of claim 26, wherein the step of producing, by each polynomial nonlinear filter, a nonlinearly filtered input data sample based on the input data sample includes:
  providing a systolic pipeline comprised of a FIR filter followed by a pipeline of delay-multiplication modules;
  filtering the input data sample with the FIR filter to produce a FIR-filtered data sample;
  multiplying, by at least one of the delay-multiplication modules, the FIR-filtered data sample by a delayed input data sample; and
  outputting, by the last delay-multiplication module in the pipeline, a nonlinearly filtered data sample.

* * * * *